(12) United States Patent
Ono et al.

(10) Patent No.: US 7,965,347 B2
(45) Date of Patent: Jun. 21, 2011

(54) ELECTRO OPTICAL DEVICE AND ELECTRONIC APPARATUS

(75) Inventors: Takahiro Ono, Shiojiri (JP); Kenichi Tanaka, Shinosuwa-machi (JP); Kazunori Takabayashi, Okaya (JP); Shinichi Terao, Azumino (JP); Takayuki Naruse, Matsumoto (JP)

(73) Assignee: Sony Corporation, Tokyo (JP)

( * ) Notice: Subject to any disclaimer, the term of this patent is extended or adjusted under 35 U.S.C. 154(b) by 360 days.

(21) Appl. No.: 12/186,196

(22) Filed: Aug. 5, 2008

(65) Prior Publication Data
US 2009/0059499 A1    Mar. 5, 2009

(30) Foreign Application Priority Data

| Sep. 3, 2007 | (JP) | 2007-227419 |
| Sep. 12, 2007 | (JP) | 2007-236288 |
| Jun. 6, 2008 | (JP) | 2008-148921 |
| Jul. 16, 2008 | (JP) | 2008-184550 |

(51) Int. Cl.
*G02F 1/1333* (2006.01)

(52) U.S. Cl. ......................................................... 349/58
(58) Field of Classification Search .................... 349/58, 349/60
See application file for complete search history.

(56) References Cited

U.S. PATENT DOCUMENTS

| 7,423,704 B2 * | 9/2008 | Cho et al. ........................ 349/58 |
| 2005/0280750 A1 | 12/2005 | Cho et al. |

FOREIGN PATENT DOCUMENTS

| JP | A-11-095214 | 4/1999 |
| JP | A-2002-221706 | 8/2002 |
| JP | A-2006-53532 | 2/2006 |

* cited by examiner

*Primary Examiner* — James A Dudek
(74) *Attorney, Agent, or Firm* — K&L Gates LLP

(57) ABSTRACT

There is provided an electro optical device including a frame including a metal unit and a resin unit, and a display panel stored in the resin unit. The resin unit is integrally formed with the metal unit to form the frame including a resin material, and at least a part of an end of the metal unit is buried in the resin unit in the state where the end is bent at a side of the display panel.

12 Claims, 17 Drawing Sheets

100b

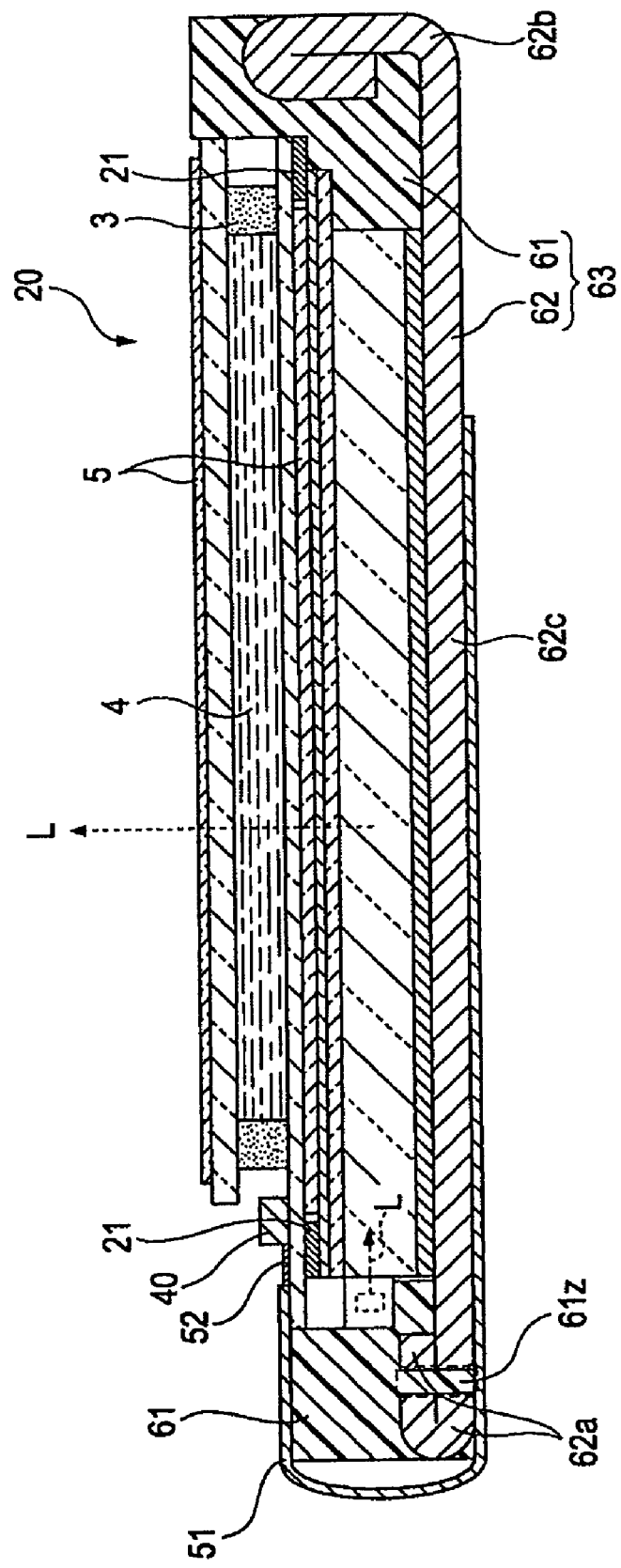

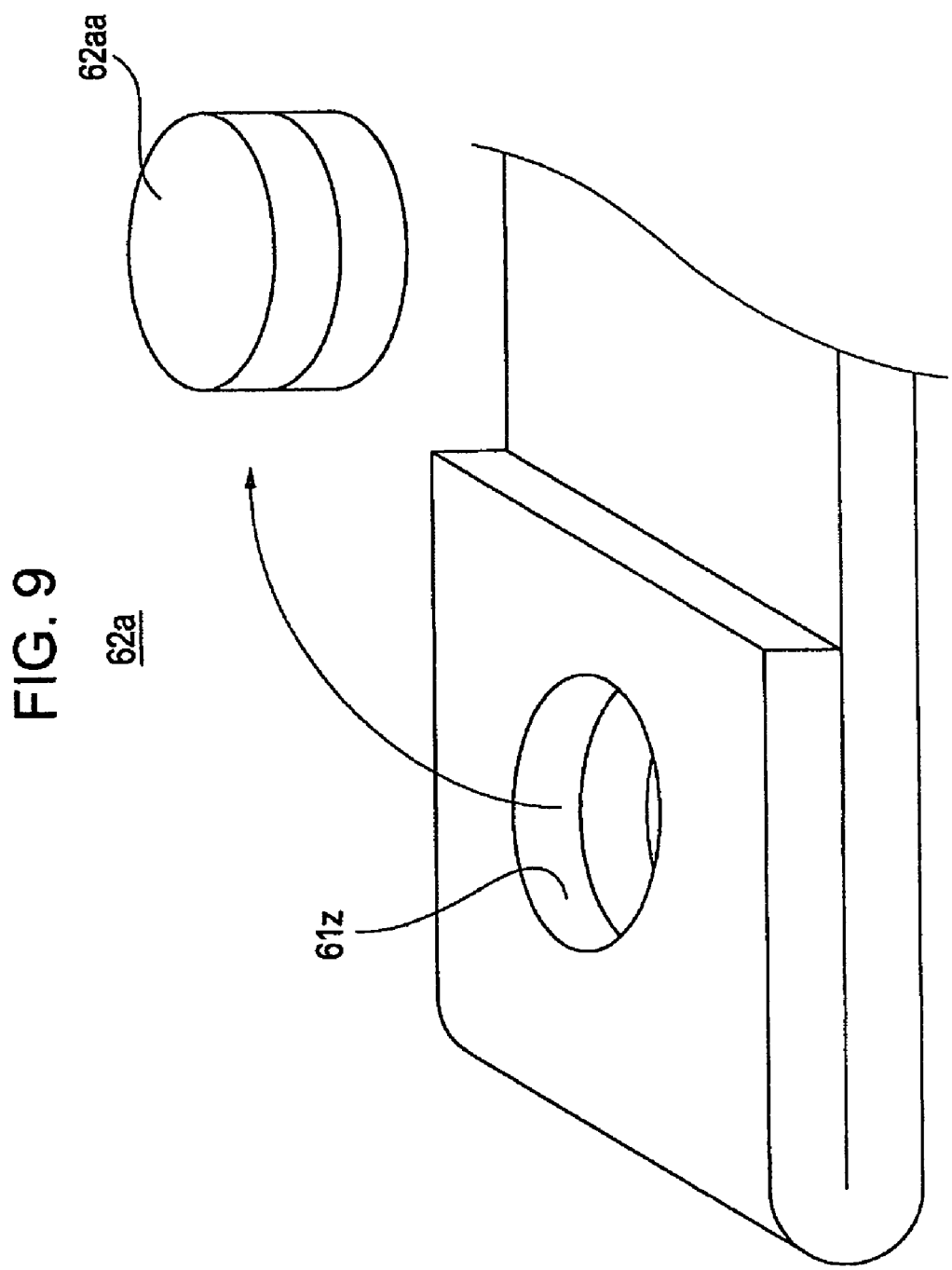

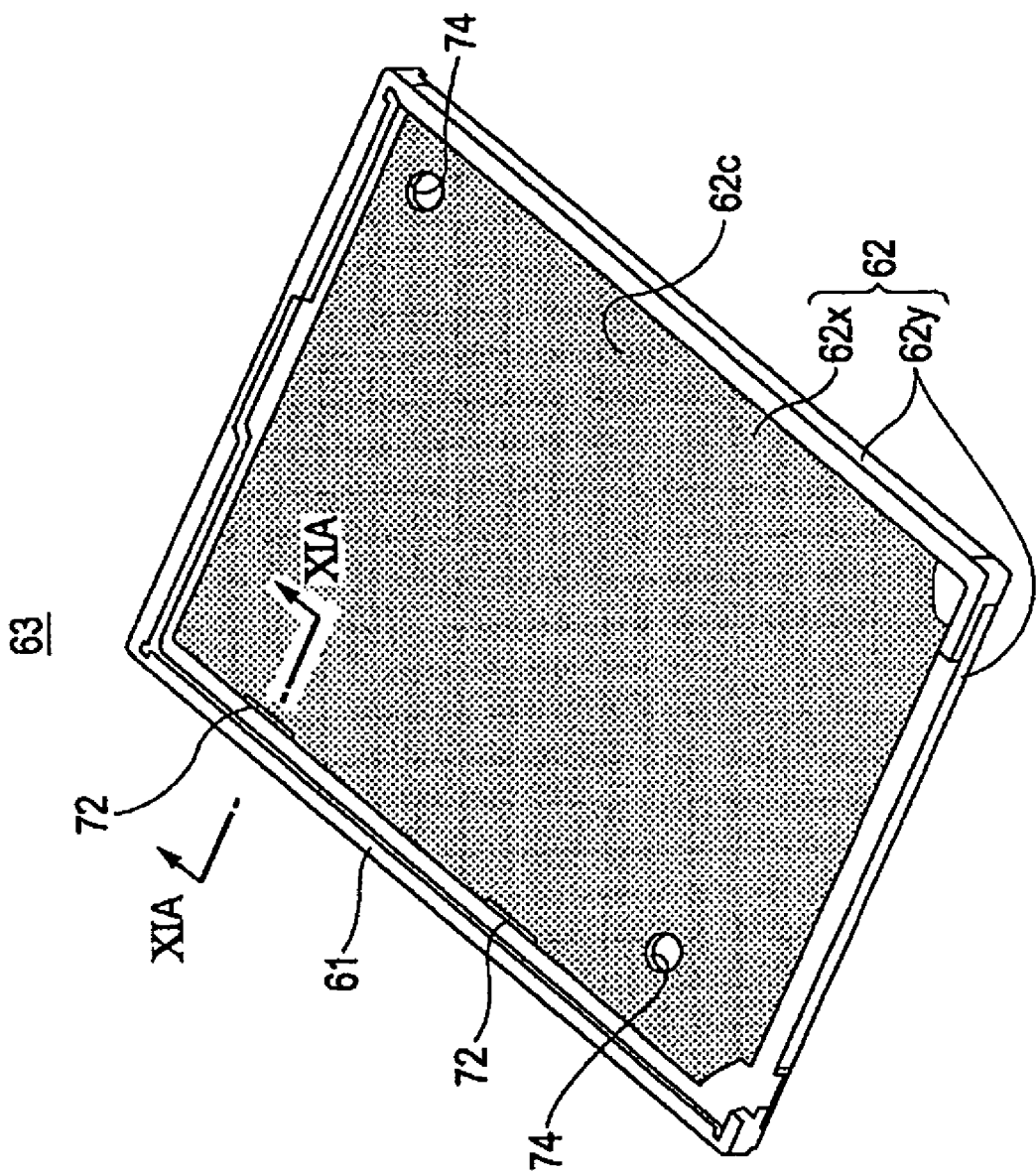

63

ELECTRO OPTICAL DEVICE AND ELECTRONIC APPARATUS

The entire disclosure of Japanese Patent Application Nos. 2007-227419, filed Sep. 3, 2007 and 2007-236288, filed Sep. 12, 2007 and 2008-184550, filed Jul. 16, 2008 and 2008-148921, filed Jun. 6, 2008 are expressly incorporated by reference herein.

BACKGROUND

1. Technical Field

The present invention relates to an electro optical device and an electronic apparatus preferably used for displaying various information.

2. Related Art

Generally, a liquid crystal display device which is one of an electro optical device mainly functions as a display panel and equipped with a liquid crystal display panel in which liquid crystal is sandwiched by two substrates and an illumination device constituted by a light guide plate having a light source such as an LED (Light Emitting Diode) or the like at an end surface. Herein, a driver IC that drives the liquid crystal display panel is provided on a substrate of the liquid crystal display panel, and is connected to an outer electronic apparatus via a FPC (Flexible Printed Circuit).

In such a liquid crystal display device, the illumination device is stored in a frame formed by a resin frame, and the liquid crystal display panel is bonded to the frame with a double face tape. Further, in order to increase the strength of the liquid crystal display device, there is a case that a metal frame other than the resin frame is separately embedded as a constituent element of the frame. In recent years, a method has been employed in which the strength of the liquid crystal display device is increased by integrally forming the resin frame and the metal frame by an insert molding or the like to design the frame.

Note that in JP-A-2002-221706, an exterior case is disclosed in which a space structure (three dimensional structure) can be realized by uniting a back side exterior case and the frame. The exterior case is united with the frame having high rigidity against deformation such as twist, deflection, or the like and making it possible to assure strength.

However, it is necessary that the conventional liquid crystal display device have a front exterior case, a back exterior case, a fixing spacer for fixing them as exteriors of liquid crystal modules. Accordingly, there is a problem in that thinning and downsizing of the electro optical device is difficult.

Further, in recent years, a big request has been made by a market as for thinning of the electro optical device, and a request has been made as for thinning of the frame with the request. There is a fear that thinning of the frame formed by a resin frame invites insufficient of strength. Accordingly, it has been proposed to increase the strength by employing a compound structure in which the frame is constituted by a resin unit and a metal unit.

SUMMARY

An advantage of some aspects of the invention is to provide an integrally molded frame having sufficient strength.

According to an aspect of the invention, there is provided an electro optical device including a frame including a metal unit and a resin unit, and a display panel stored in the resin unit. The metal unit and the resin unit are integrally formed to constitute the frame, and at least a part of an end of the metal unit is buried in the resin unit in the state where the end is bent at a side of the display panel.

The electro optical device is equipped with a display panel and a frame. The display panel is fixed to the frame. The metal unit and the resin unit are integrally formed to constitute the frame. At least a part of an end of the metal unit is buried in the resin unit in the state where the end is bent. The frame is formed by the metal unit and the resin unit in the state where the end is bent, so that sufficient strength can be obtained even when the frame itself is thinly formed. That is, since the end of the metal unit has a bent shape, the thickness of the metal unit is increased. Accordingly, strength of the electro optical device against impact or the like can be increased. Further, since at least a part of the end is buried in the resin unit, the metal unit can be firmly fixed by anchoring effect (improvement of size accuracy due to high adhesiveness, improvement of reliability with respect to detachment). Further, occurrence of detachment or the like caused by a difference of heat expansion coefficients between the metal and the resin can be also prevented by the anchoring effect, and it becomes possible to provide the frame having high adhesiveness and superior is reliability for a long period. Further, since the display panel is stored in the resin, an effect can be also provided in which the display panel is protected from being broken by a cushion effect provided by the resin unit.

According to another aspect of the invention, there is provided an electro optical device including a frame including a metal unit and a resin unit, and a display panel stored in the resin unit. The metal unit and the resin unit are integrally formed to constitute the frame, and at least a part of an end of the metal unit is buried in the resin unit in the state where the end is folded at a side of the display panel.

The electro optical device is equipped with a display panel and a frame. The display panel is fixed to the frame. The metal unit and the resin unit are integrally formed to constitute the frame. At least a part of an end of the metal unit is buried in the resin unit in the state where the end is folded at a side of the display panel. Since strength at the folded portion is increased by folding the end of the metal unit and the folded end is buried in the resin unit, strength of the electro optical device against pressure from the viewing side of the electro optical device, deformation, deflection, bending, impact, and the like applied to the display panel caused by a force applied to the electro optical device can be increased.

It is preferable that a step between a bottom of the metal unit and the folded end of the metal unit is buried by the resin unit in the electro optical device according to the aspects of the invention. Herewith, at least a part of the end is buried in the resin unit. Accordingly, the metal unit can be firmly fixed by anchoring effect (improvement of size accuracy and reliability).

It is preferable that an end of the resin unit is projected outside from the end of the metal unit in the electro optical device according to the aspects of the invention. Herewith, even when a member such as a cover, a housing, a touch panel, or the like of the electro optical device is overlapped on the display panel, concentration of a stress applied to an electro optical panel is reduced and the stress is let out in the metal unit by the resin unit projected from the end. Accordingly, an effect of preventing splitting, cracking, an abnormal display, or the like can be obtained.

It is preferable that the metal unit of an outer surface of the frame is exposed in the electro optical device according to the aspects of the invention. Herewith, strength of the outer circumference of the frame is increased.

It is preferable that the metal unit of an inner surface of the frame is exposed in the electro optical device according to the aspects of the invention. Herewith, the design size accuracy of the display panel and the like placed in the frame can be enhanced. Further, electric shielding property with respect to the display panel and the like placed in the frame can be also improved.

It is preferable that the metal unit of a bottom of the frame is exposed in the electro optical device according to the aspects of the invention. Herewith, electric shielding property with respect to the display panel and the like is improved.

It is preferable that the metal unit is fixed in the resin unit in the electro optical device according to the aspects of the invention. Herewith, strength of the frame can be assured and the display panel can be protected by a cushion effect with a resin unit. Further, it becomes unnecessary to separately provide a fixing member such as an upper case. Accordingly, a thinner electrical panel can be provided.

It is preferable that the metal unit is formed so that an end of the end is folded to overlap in a thickness direction of the display panel in the electro optical device according to the aspects of the invention. Herewith, the strength can be assured while restraining the thickness in the display panel direction.

It is preferable that the metal unit is formed so that the end has a multi folded shape in the electro optical device according to the aspects of the invention. Herewith, strength of the electro optical device can be further increased.

It is preferable that the end of the metal unit is formed by a heming process in the electro optical device according to the aspects of the invention. Herewith, the thickness of a portion of the metal unit that is subjected to a heming process becomes the double of the thickness of the metal unit. Accordingly, an effect of protecting the display panel from deformation, deflection, bending, impact, and the like can be provided.

It is preferable that the resin unit has a convex portion at an end, and the end of the metal unit is bent to oppose the metal unit to keep a predetermined space with the metal unit, and the end of the metal unit is embedded in the resin unit to cover the convex portion in the electro optical device according to the aspects of the invention. Herewith, the area in which the metal unit and the resin unit are adhered is increased. Accordingly, strength of the electro optical device can be increased.

It is preferable that the metal unit has a hole that passes through the metal unit or an irregularity formed on a surface of the metal unit, and the resin unit is formed to cover the hole or the irregularity in the electro optical device according to the aspects of the invention. Herewith, the area in which the metal unit and the resin unit are adhered is increased. Accordingly, strength of the electro optical device can be increased.

It is preferable that the hold is the one that is formed by deforming a part of the metal unit bent in an L character shape in the electro optical device according to the aspects of the invention. Herewith, the area in which the metal unit and the resin unit are adhered is increased, and strength of the electro optical device can be increased.

According to still another aspect of the invention, there is provided an electronic apparatus equipped with the electro optical device as a display unit.

BRIEF DESCRIPTION OF THE DRAWINGS

The invention will be described with reference to the accompanying drawings, wherein like numbers reference like elements.

FIG. 8 is a cross sectional view showing a liquid crystal display device according to an embodiment in the case where a hole is provided at an end of the metal unit.

FIG. 9 is a perspective view showing an end of the metal unit in which a hole is provided.

FIG. 10 is a perspective view showing a frame according to the embodiment.

DESCRIPTION OF EXEMPLARY EMBODIMENTS

Hereinafter, a preferable embodiment of the invention will be described with reference to the accompanying drawings. Note that, the invention is applied to a liquid crystal display device in the embodiment described below. Note that an electro optical device to which the invention can be applied is not limited to the liquid crystal display device, and the invention can be also applied to an electro optical device that employs an organic EL (OLED: Organic Light Emitting Diode), a plasma panel, or the like.

Liquid Crystal Display Device

Figure 1:
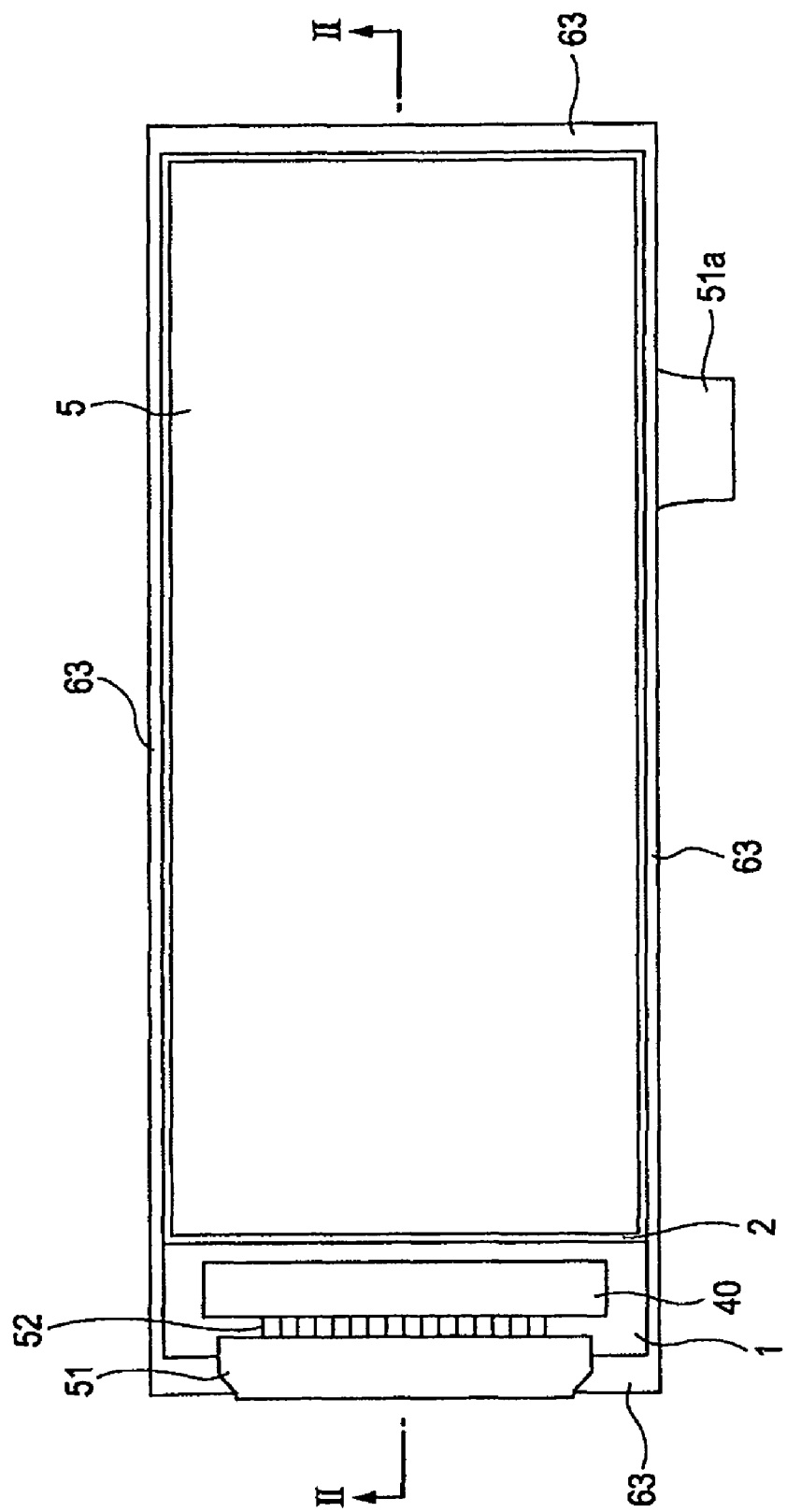
FIG. 1 is a plan view of a liquid crystal display device according to an embodiment of the invention.
Figure 2:
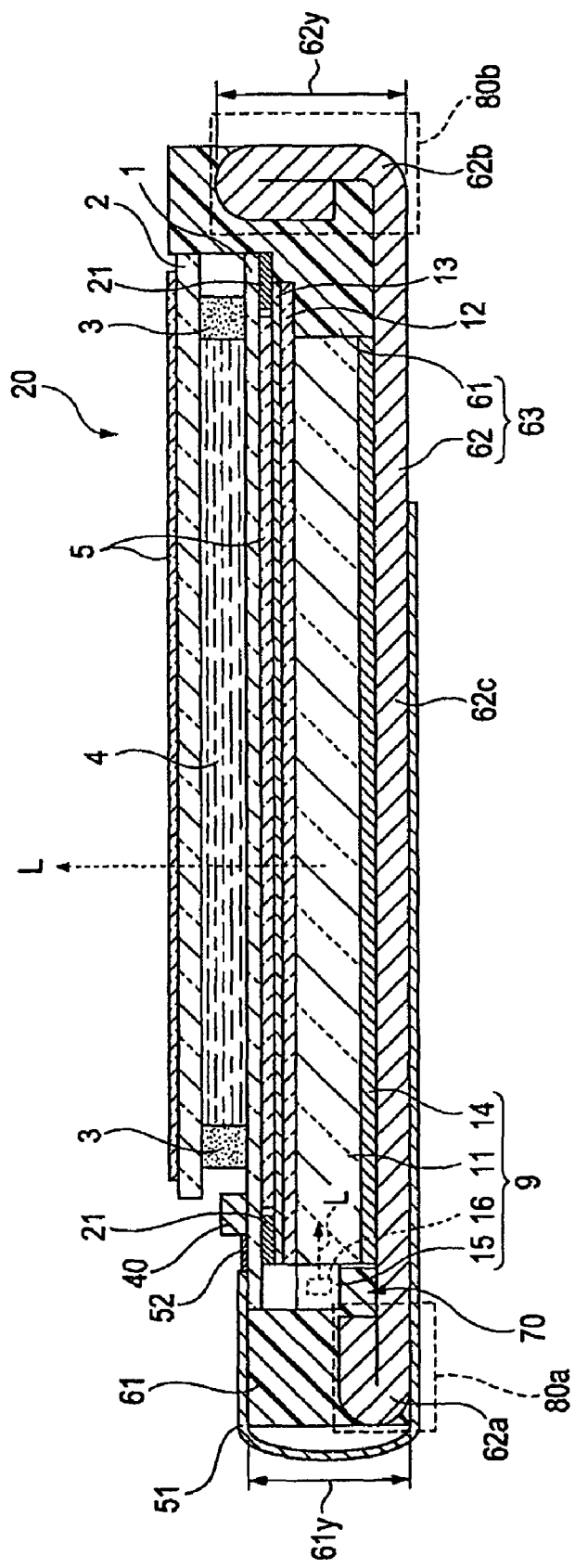
FIG. 2 is a cross sectional view of the liquid crystal display device according to the embodiment.

FIG. 1 is a plan view showing a liquid crystal display device 100 according to the embodiment, and FIG. 2 is a cross sectional view taken along the line II-II of FIG. 1, showing the liquid crystal display device 100.

As shown in FIG. 2, the liquid crystal display device 100 is mainly constituted by an illumination device 9 and a liquid crystal display panel (display panel) 20. The liquid crystal panel 20 is disposed to oppose the upper surface of a light guide plate 11.

The illumination device 9 is constituted by the light guide plate 11, a reflection sheet 14, and a light source unit 15. The reflection sheet 14 is disposed on the lower surface of the light guide plate 11. The light source unit 15 is disposed at an end surface of the light guide plate and is equipped with a plurality of LED's 16 each of which is a point light source. The light L emitted from each LED 16 is introduced into the light guide plate 11, repeatedly reflected at the upper and lower surfaces of the light guide plate 11 to change the direction, and emitted to the outside from the upper surface. The emitted light L proceeds toward the liquid crystal display panel 20.

The liquid crystal display panel 20 has a display area that is approximately the same as the light emitting area of the light guide plate 11. Substrates 1, 2 made of a glass or the like are bonded together via a seal material 3 to constitute a cell structure, and liquid crystal 4 is enclosed therein to constitute the liquid crystal display panel 20. The liquid crystal display panel 20 is equipped with a polarizer 5 on the outer surface of each of the substrates 1, 2.

For example, a diffusion sheet 12 and a prism sheet 13 are provided between the illumination device 9 and the liquid crystal display panel 20 as optical sheets. The diffusion sheet 12 has a role to diffuse the light L emitted from the light guide plate 11 in all directions. The prism sheet 13 has a role to focus the light L on the liquid crystal display panel 20. The cross section of the prism sheet 13 has a prism shape of an approximately triangle, and the prism sheet has a shape in which the prism shape is extended in the direction of one side (side direction perpendicular to the cross section). The light emitted from the light guide plate 11 is transmitted through the liquid crystal display panel 20 after passed through the optical sheets. Herewith, the liquid crystal display panel 20 is illuminated.

A driver IC 40 which is a drive IC (driver) for driving liquid crystal is directly mounted on the liquid crystal display panel 20 by a COG (Chip On Glass) technology. An FPC (Flexible Printed Circuit) 51 is connected to an end of the liquid crystal display panel 20. A part of terminals of the driver IC 40 are connected to the FPC 51 via wirings 52 formed on the liquid crystal display panel 20. A connector 51a (see FIG. 1) is provided at the other end of the FPC 51. An external electronic apparatus is electrically connected to the connector 51a. The driver IC 40 drives a driving circuit of the liquid crystal display panel 20 based on a control signal supplied from the external electronic apparatus via the FPC 51. Herewith, the alignment state of the liquid crystal 4 is controlled.

The illumination device 9, that is, the light guide plate 11, the reflection sheet 14, and the light source unit 15 are embedded in an opening of the frame 63 having a frame shape formed by a resin unit and a metal unit. Further, the optical sheets such as the diffusion sheet 12, the prism sheet 13, and the like are disposed on the upper surface of the light guide plate in the frame 63. The liquid crystal display panel 20 is attached to the frame 63 by adhesion to cover the opening of the frame 63 with a double face tape 21 having a frame shape having light shielding property. The liquid crystal display panel 20 is housed in the resin.

Shape of Frame

Next, the shape of the frame 63 will be described in detail. The frame 63 is constituted by the resin unit 61 and the metal unit 62. The resin unit 62 is integrally formed with the metal unit 61 to form the frame 63 including a resin material. The resin unit 61 mainly forms the outer shape of the frame 63 and the metal unit 62 has a characteristic to enhance the strength of the frame 63 against impact or the like. The frame 63 is formed by so called an insert molding in which the metal unit 62 is set in a mold and the melt resin unit 61 is filled in the mold to surround the metal unit 62 for solidification. In the frame 63, the effect that strength of the frame is increased can be obtained by the metal unit 62, and the effects that size assurance with the display panel and prevention of scratch and the buffering effect as an alternative of a cushion or the like can be obtained by the resin unit 61. As a result, anti press strength, anti drop strength, and anti vibration strength are improved as the entire frame.

The metal unit 62 can be separated into an end 62a, the other end 62b, and a bottom 62c. The end 62a is a part of the metal unit 62 that is positioned at the area in a broken line frame 80a shown in FIG. 2. That is, the end 62a is an end of the metal unit positioned at the portion sandwiched by the FPC 51, and is a part covered by the FPC 51 among the four sides of the outer frame of the liquid crystal display device 100 shown by the plan view of FIG. 1. The other end 62b is a part of the metal unit 62 positioned at the area in a broken line frame 80b. That is, the end 62b is an end of the metal unit positioned at the portion that is not sandwiched by the FPC 51. The bottom 62c is the portion of the metal unit 62 positioned in the area except the area in the broken line frame 80a and the area in the broken line frame 80b.

Note that the metal unit 62 of the liquid crystal display device 100 shown in FIG. 2 is constituted by one segment from the end 62a to the end 62b. However, an embodiment to which the invention can be applied is not limited to the structure. For example, the metal unit of the end 62a and the metal unit of the end 62b may be formed by two metal units that are physically separated for convenience of design of the frame 63.

In the embodiment, the FPC 51 and the like are disposed above the end 62a, so that the height of the shape of the end 62a of the metal unit 62 in the broken line frame 80a of FIG. 2 is restricted to $61y$ of FIG. 2. Then, the height $62y$ of the shape of the other end 62b in the broken line frame 80b is higher than $61y$, so that it is impossible to uniform the shapes of the end 62a and the end 62b. That is, the metal unit 62 is formed so that the height of one end is lower than that of the other end.

Figure 3:
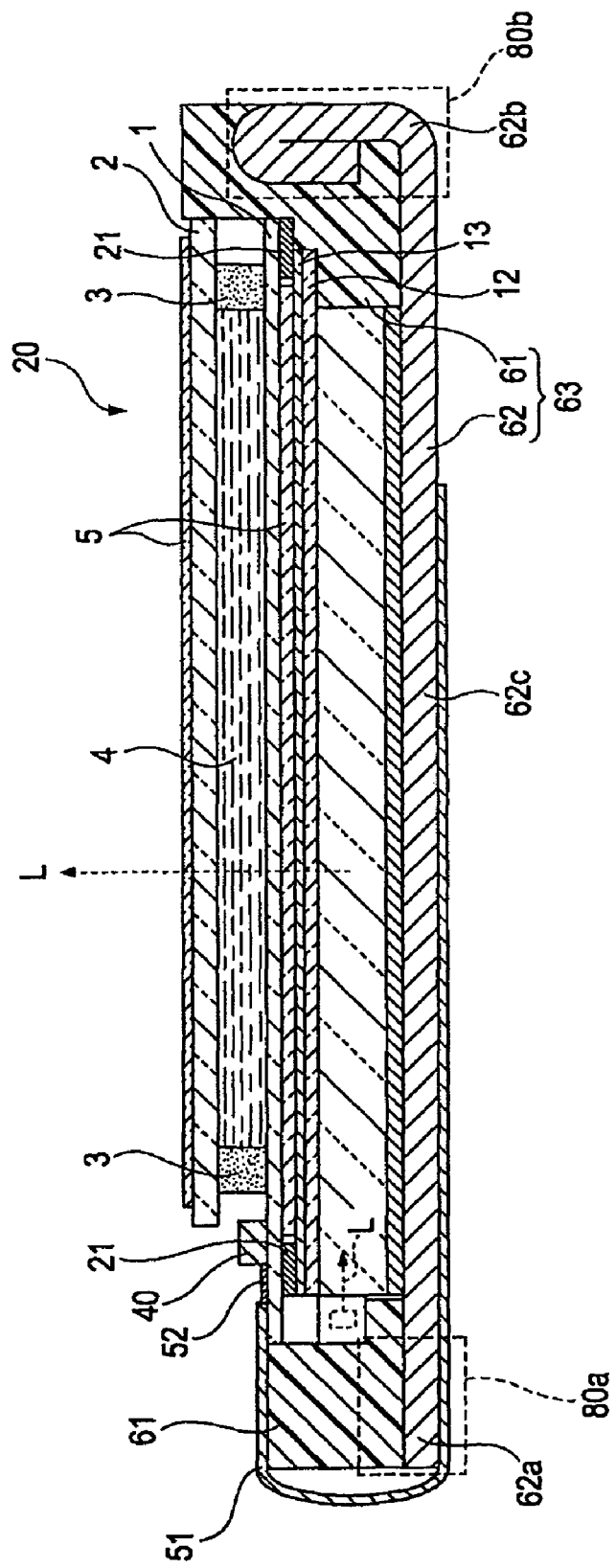
FIG. 3 is a diagram showing an example of a cross sectional view of a liquid crystal display device different from the embodiment.

On the other hand, as shown is a liquid crystal display device 10a of FIG. 3, there is a method in which the end 62a of the metal unit 62 is not bent is matched to the width of the resin unit 61. However, with the method, the strength of the liquid crystal display device 100a can not be increased.

Consequently, in the liquid crystal display device 100 according to the embodiment, as shown in FIG. 2, the end 62a of the metal unit 62 is folded in the resin unit 61. The end 62a is formed by, for example, a heming process. Note that a space may be provided in the folded end 62a. Herewith, the height of the end 62a can be restrained to about the double of the thickness of the metal unit 62. Accordingly, it becomes possible to from the end 62a so as not to exceed the height $61y$. Further, a step (gap) 70 between the bottom 62c of the metal unit 62 and the folded end 62a of the metal unit 62 is buried by the resin unit 61. As shown by the broken line frame 80a of FIG. 2, the space 70 exists between the folded end 62a and the bottom 62c of the metal unit 62, and the gap 70 is buried by the resin unit 61. Further, at least a part of the folded end 62a is buried in the resin unit 61, so that the strength of the liquid crystal display device 100 against impact or the like can be increased as compared with the liquid crystal display device 100a shown in FIG. 3. Further, since at least a part of the end 62a is buried in the resin unit 61, the metal unit 62 can be firmly fixed (by anchoring effect) (improvement of size accuracy and reliability). Note that it is not limited that the end is bent by 180 degrees by a heming process, and a small gap may be provided at the bent heming portion and a resin may be flowed therein. The direction to be bent by the heming is not limited to the direction shown in the embodiment as far as the end is bent by 180 degrees. Further, another bent portion may be formed at a midstream of the heming bent portion. Herewith, the thickness of the bent portion becomes the double as compared with the normal case, so that the strength can be further increased.

Figure 4:
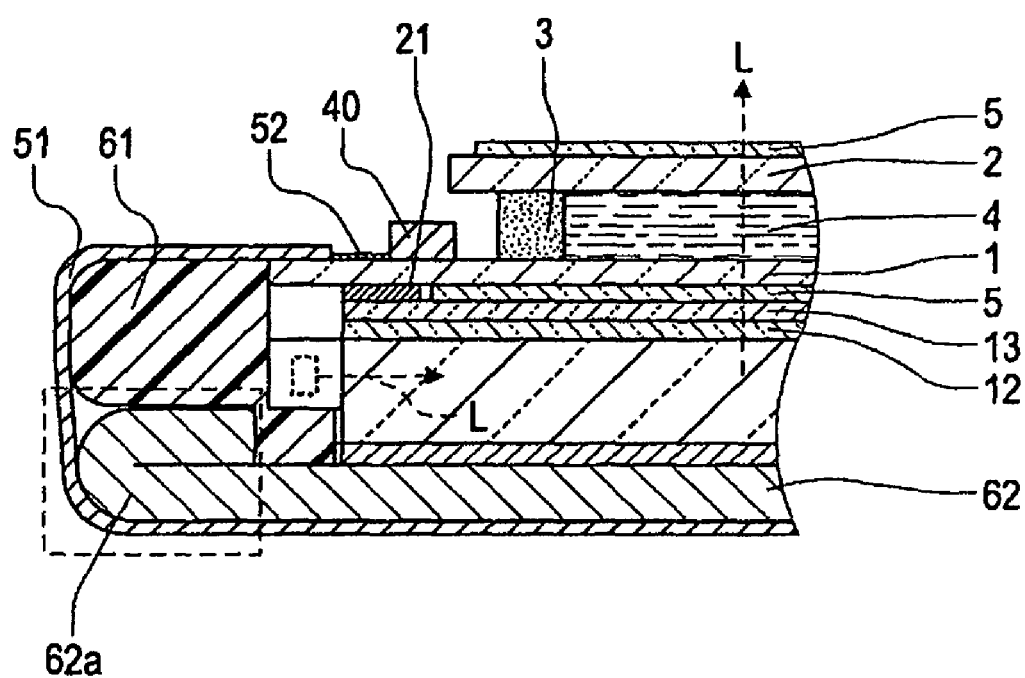
FIG. 4 is a cross sectional view showing a liquid crystal display device according to an embodiment in the case where an end of a resin unit is projected from an end of a metal unit.

FIG. 4 is a cross sectional view showing a liquid crystal display device 100e according to another embodiment. As shown in FIG. 4, the end 62a of the metal unit 61 positioned in the broken line frame is folded at the resin unit 61 side. Herewith, the end 62a has a rounded shape at the portion making contact with the FPC 51, and occurrence of disconnecting and damage of the FPC 51 caused by making contact with the end 62a can be prevented. Note that there is a case that a corner of the resin unit 61 is made contact with the FPC 51 depending on the shape of the end 62a. In such a case, it is preferable that the shape of the corner of the resin unit 61 is formed to have a round shape as shown in FIG. 4. Herewith, the disconnecting and damage of the FPC 51 caused when the FPC 51 is made contact with the corner of the resin unit 61 can also be prevented.

Further, the end of the resin unit 61 is disposed to project form the end 62a of the metal unit 62, and the end 62a of the metal 62 is folded and is buried in the resin unit 61. Herewith, the FPC 51 is bent along the projected resin unit 61, so that it is prevented that the FPC 51 is bent to a sharp angle at the end 62a of the metal unit 62. Accordingly, damage and disconnecting of the FPC 51 caused by a concentrated stress of bending can be prevented.

FIG. 10 is a perspective view showing the frame 63 of the liquid crystal display device 100. As shown in FIG. 10, the frame 63 is constituted by the metal unit 62 and the resin unit 61 that are integrally formed by an insert molding. Then, there exists a portion 62x at which the metal unit 62 is exposed at the inner surface of the frame 63, that is at the surface on which the liquid crystal display panel 20 and the like are placed, and a portion 62y at which the metal unit 62 is exposed at the outer surface of the frame 63, that is the surface which appears as an appearance of the liquid crystal display device 100 and which is not the inner surface. Note that one surface of the bottom surface (bottom) is also exposed in the frame 63 of the liquid crystal display device 100. That is, the back surface of the portion 62x at which the metal unit 62 of the inner surface of the frame 63 is exposed is included in the portion 62y that is exposed at the outer surface. Herewith, electric shielding property can be improved by the portion 62x and strength against impact or the like can be improved by the portion 62y. Further, size assurance with the liquid crystal display panel 20 and the like, prevention of scratch, and a buffering effect as an alternative of a cushion or the like can be expected by the portion of the resin unit 61. Slits 72 and holes 74 are provided at the bottom 62c of the metal unit 62. The hole 74 is used for positioning of the metal unit 62 when performing an insert molding and contributes for assembling.

Figure 11A:
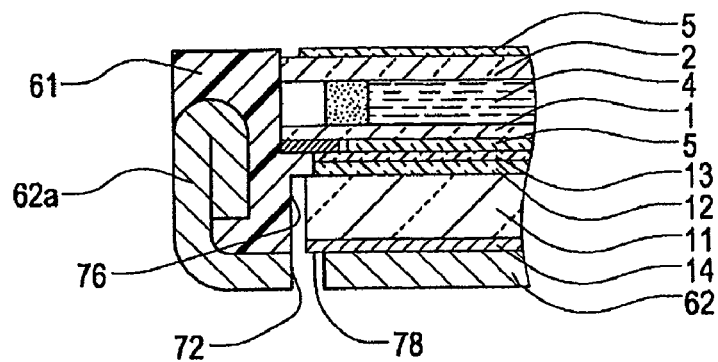
FIG. 11A is a cross sectional view taken along the line XIA-XIA of FIG. 10, showing the frame.
Figure 11B:
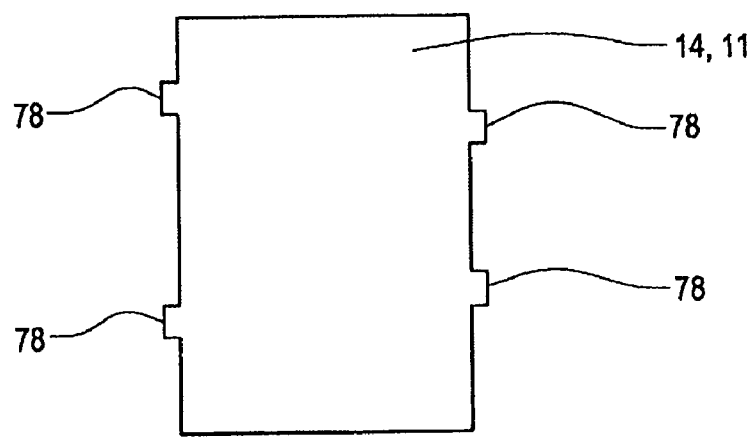
FIG. 11B is a plan view showing a reflection sheet (or a light guide plate)
Figure 11C:
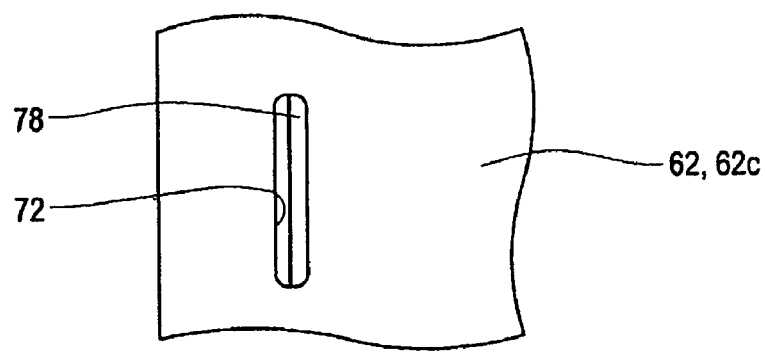
FIG. 11C is a plan view showing the frame.

FIGS. 11A to 11C are each a diagram illustrating a way to fix the reflection sheet 14 and the light guide plate 11 to the frame 63. FIG. 11A is a cross sectional view taken along the line XIA-XIA of FIG. 10, showing the frame 63. Note that the reflection sheet 14 and the light guide plate are included in FIG. 11A. FIG. 11B is a plan view showing the reflection sheet 14 (or the light guide plate 11). FIG. 11C is a plan view showing the frame 63. As shown in FIG. 11A, a cutout 76 is provided in the resin unit 61 at the position corresponding to the slit 72 of the metal unit 62. Four convex portions 78 (FIG. 11B) provided in a vertically and horizontally asymmetric manner in plan view in the reflection sheet 14 and the light guide plate 11 are fitted to the cutouts 76 to contribute for fixing and assembling of the reflection sheet 14 and the light guide late 11. The slits 72 and the cutouts 76 are respectively provided in the metal unit 62 and the resin unit 61 in a vertically and horizontally asymmetric manner in plan view. As shown in FIG. 11C, the convex portions 78 of the reflection sheet 14 or the light guide plate 11 can be viewed and confirmed through the slit 72. Herewith, upside-down of the reflection sheet 14 and the light guide plate 11 can be prevented, and reliability is improved.

Figure 12:
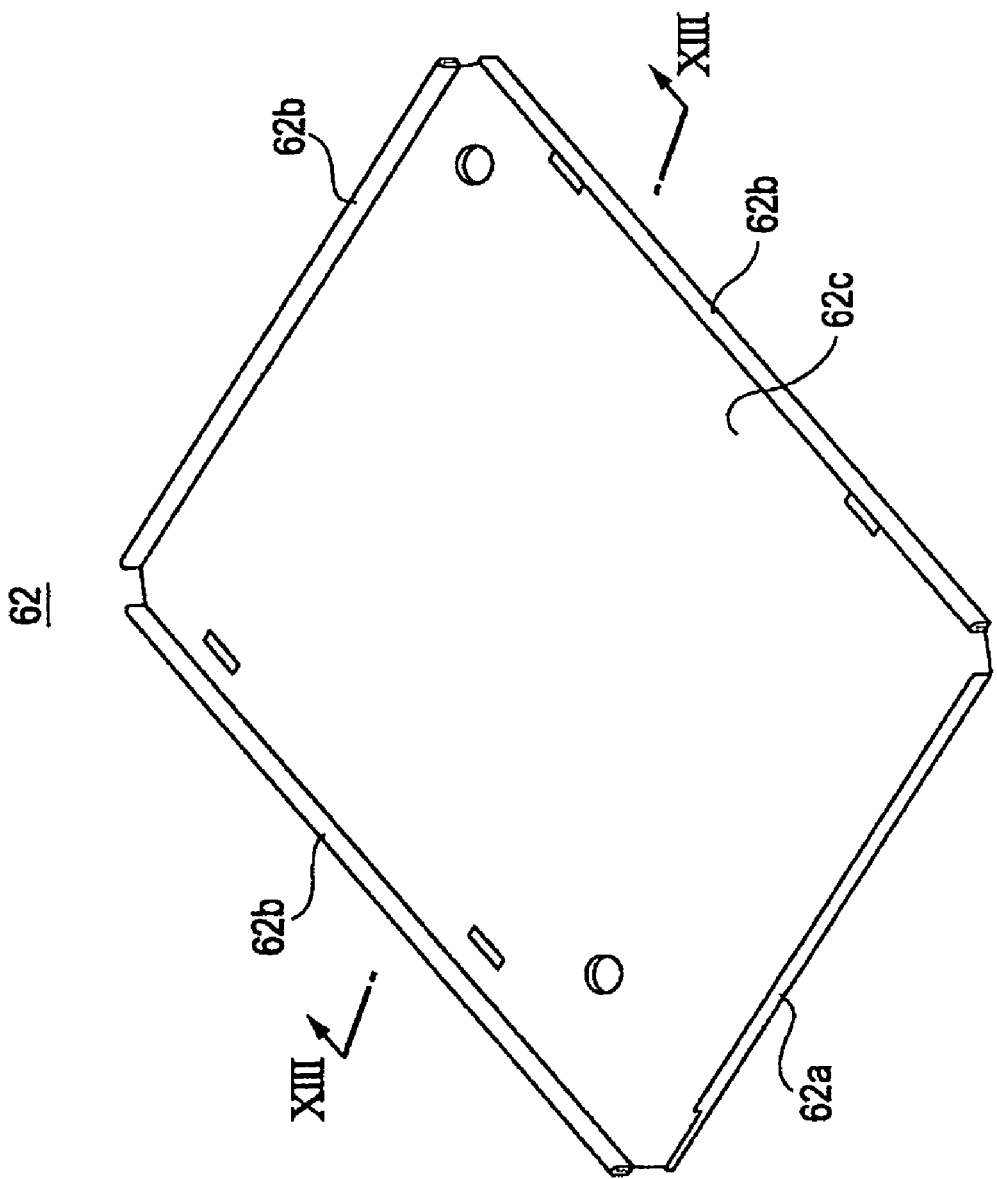
FIG. 12 is a perspective view showing the metal unit according to the embodiment.
Figure 13:
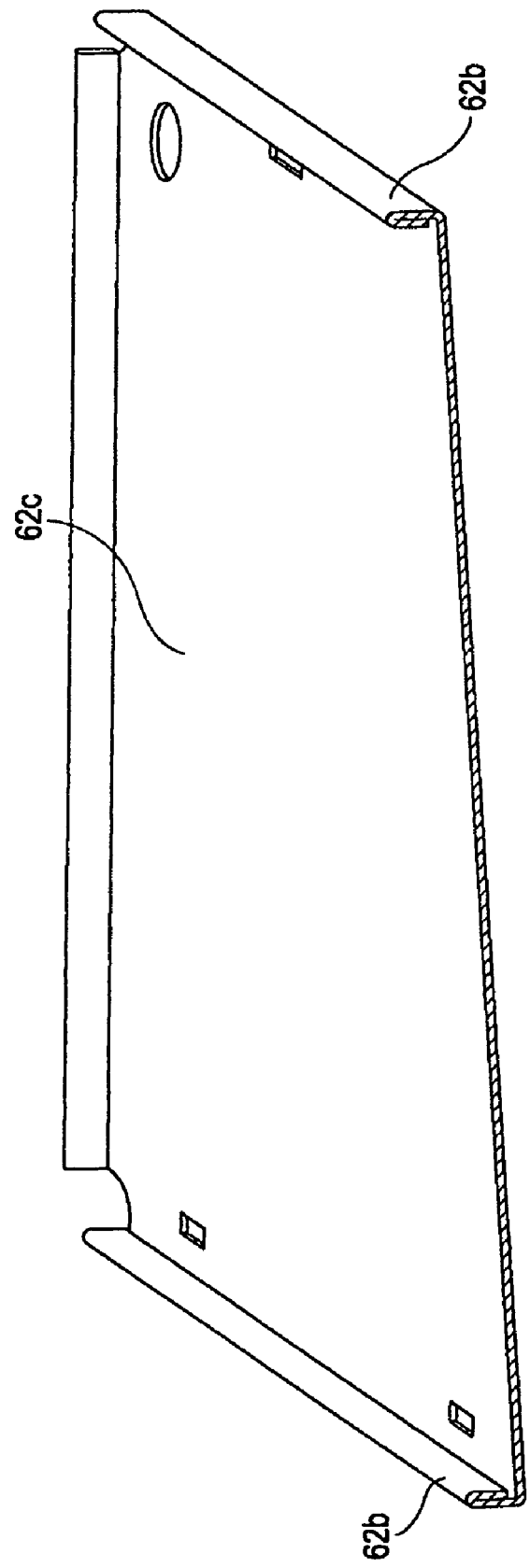
FIG. 13 is a perspective view taken along the line XIII-XIII of FIG. 12, showing the metal unit.

FIG. 12 is a perspective view showing only the whole metal unit 62, and FIG. 13 is a perspective view taken along the line XIII-XIII of FIG. 12, showing the metal unit 62. As shown in FIG. 12, only the end 62a portion of the metal 62 at which the FPC 51 is disposed is folded at the display panel 20 side so that the bottom surface does not rise in the vertical direction. The other end 62b is bent so that the bottom surface rises in the vertical direction and thereafter folded at the display panel 20 side. Accordingly, the end 62a is designed to be lower than the other end 62b. That is, as shown in FIG. 13, the end 62b is bent in an L character shape and the end of the end 62b is folded. Herewith, anti press strength, anti drop strength, and anti vibration strength of the liquid crystal display device 100 can be improved.

Figure 14:
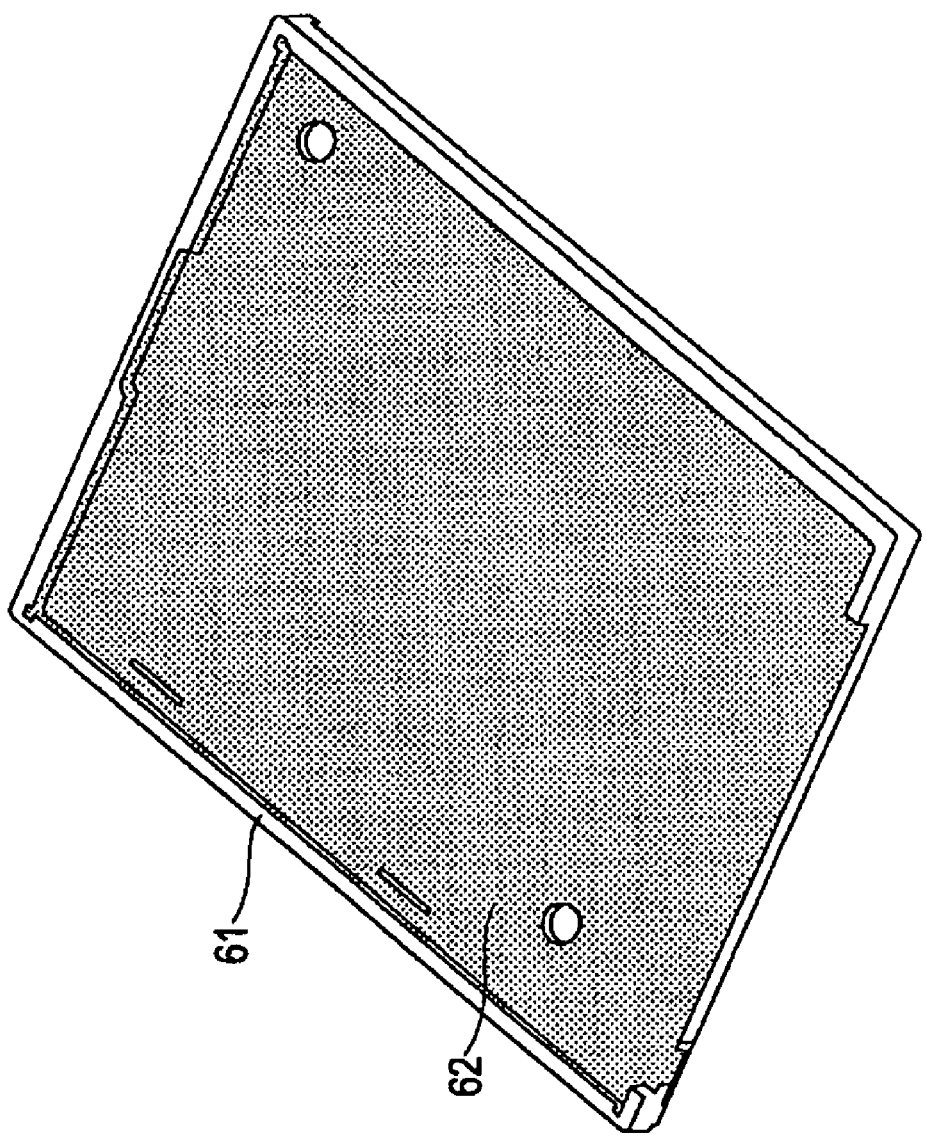
FIG. 14 is a perspective view showing a frame in the case where the metal unit is disposed at the inner surface of the frame.

Further, as shown in FIG. 14, the frame 63 may be constituted so that the metal unit 62 is disposed so as to be exposed at the inner surface of the frame 63 and the outer surface of the frame 63 is covered by the resin unit 61. Herewith, the size accuracy of the display panel 20 and the like inside the frame can be enhanced, and electric shielding property can be improved.

Figure 15:
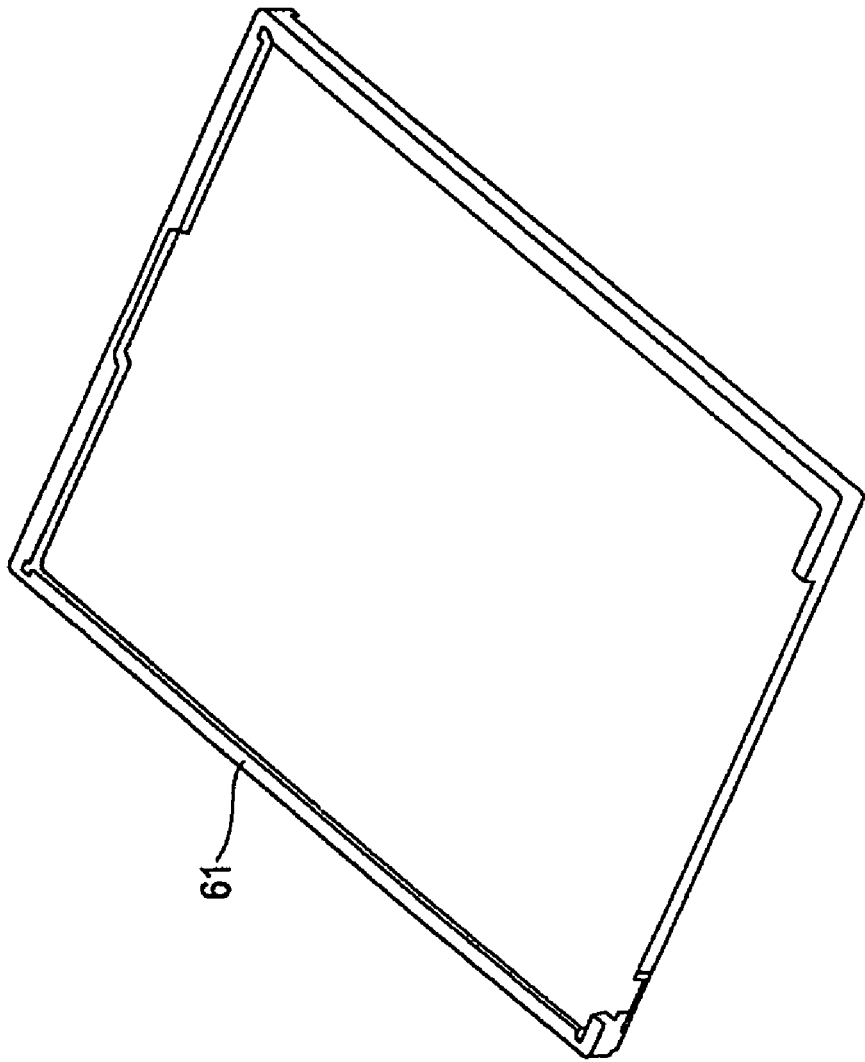
FIG. 15 is a perspective view showing a frame in the case where the metal unit is fixed in the resin unit.

Note that, the frame may be constituted so that the metal unit is not exposed and the resin section 61 is constituted at the inner surface and the outer surface of the frame 63 as shown in FIG. 15. That is, the structure may be employed in which the whole surfaces of the metal unit are covered by the resin unit 61 and the metal unit is invisible. Herewith, the strength can be increased by using the metal unit, and the liquid crystal display panel 20 and the like can be protected by the resin unit 61 that works as a cushion.

Figure 6:
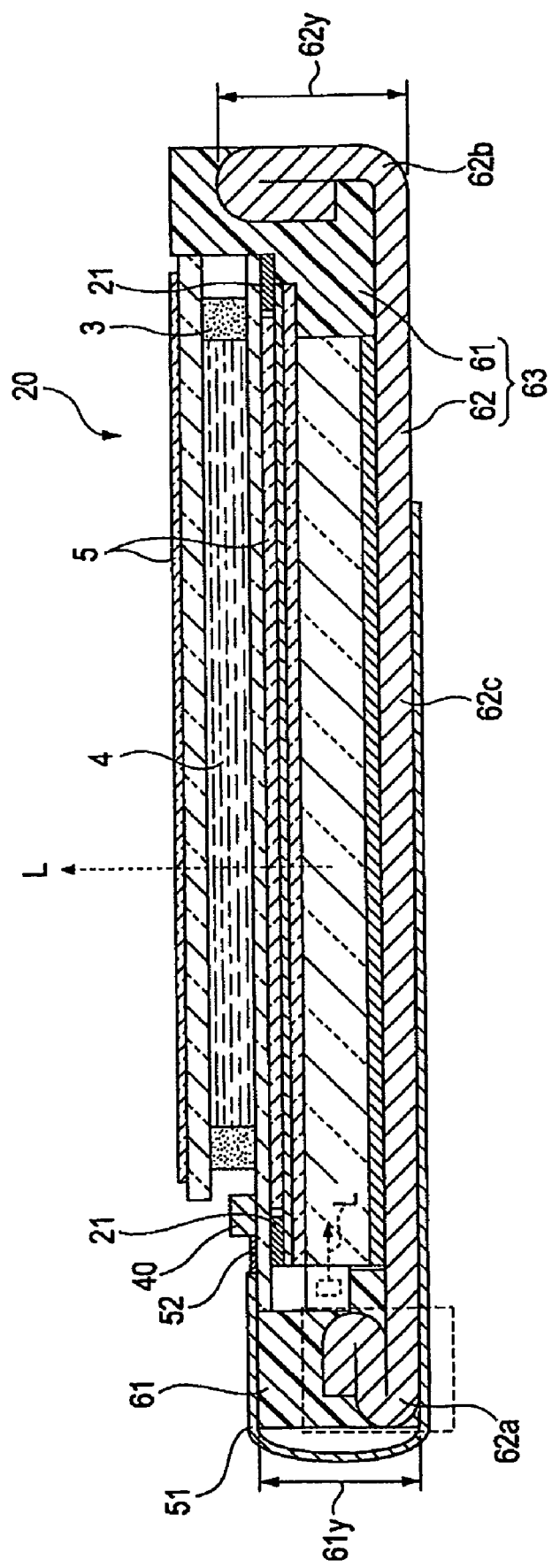
FIG. 6 is a cross sectional view showing a liquid crystal display device according to an embodiment in the case where an end of the metal unit is formed to have a multi folded shape.

FIG. 6 is a cross sectional view of a liquid crystal display device 100b according to another embodiment. As shown in FIG. 6, the end 62a may also be a multi folded shape. Also with the shape, the height can be restrained than the height 62y of the end 62b, and it is possible to form the end 62a within the range that does not exceed the height 61y. Further with the multi folded shape, the strength of the liquid crystal display device 100b against impact or the like can be increased.

Figure 7:
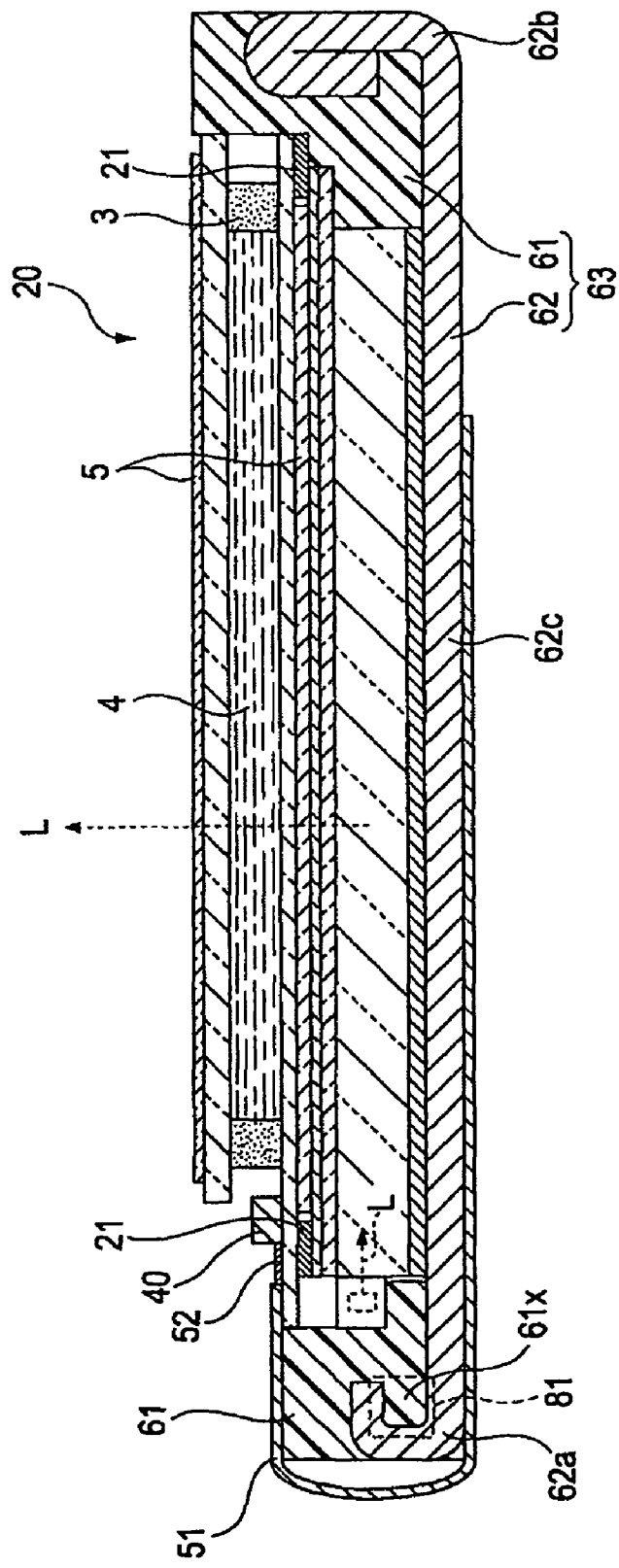
FIG. 7 is a cross sectional view showing a liquid crystal display device according to an embodiment in the case where the metal unit is folded to have a predetermined space.

FIG. 7 is a cross sectional view showing a liquid crystal display device 100c according to a still another embodiment. As shown by the liquid crystal display device 100c shown in FIG. 7, the metal unit 62 may be formed so that the end 62a is bent to oppose the metal unit 62 to keep a predetermined space 81. In this case, the resin unit 61 is formed to match the space 81. That is, a convex portion 61x is formed at an end of the resin unit 61 and the end 62a of the metal unit 62 is bent to cover the convex portion 61x. Herewith, the metal unit 62 is embedded in the resin unit 61, and the resin unit 61 and the metal unit 62 are fixed. Accordingly, the strength of the liquid crystal display, device 100c can be increased.

FIG. 8 is a cross sectional view showing a liquid crystal display device 100d according to a still another embodiment. In the embodiment, a hole 61z is provided in the folded end 62a of the metal unit 62. FIG. 9 is a perspective view showing the end 62a of the metal unit according to the liquid crystal display device 100d. In FIG. 9, a center 62aa of the end 62a is hollowed and the hole 61z is formed in the end 62a. Then, the hole 61z is buried with the resin unit 61 when the frame 63 is integrally formed. Herewith, the resin unit 61 is embedded in the hole 61z of the metal unit and the strength of the liquid crystal display device 100d can be increased. Further, by providing an irregularity on the surface of the metal unit 62 besides the hole 61z, the resin unit 61 is embedded in the irregularity of the metal unit, that is, the area in which the metal unit 62 and the resin unit 61 are adhered is increased. Accordingly, the strength of the liquid crystal display device 100d can be also increased.

Modifications

Next, a modification of the invention will be described. In the liquid crystal display devices 100 and 100b to 100e according to the aforementioned embodiments, an end of the end 62a of the metal unit is folded in order to satisfy the restriction of the height that is imposed to the metal unit 62 and to increase the strength of the liquid crystal display devices. However, a liquid crystal display device to which the invention can be applied is not limited to the devices.

Generally, it is physically impossible to fold the end of the metal unit unless the end has a predetermined length. Accordingly, when the length of the end 62a of the metal unit is shorter than that of the liquid crystal display devices 100 and 100b to 100e, it is impossible to perfectively fold to form the end 62a.

Figure 5:
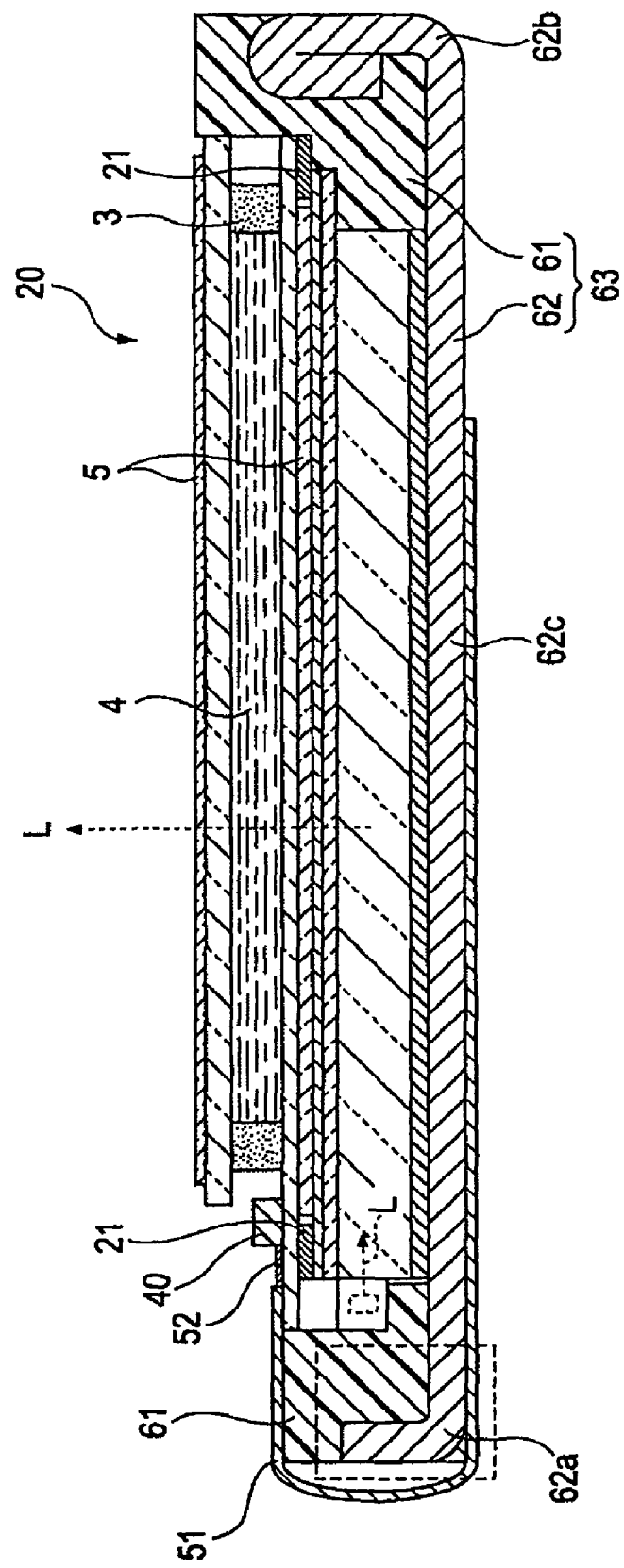
FIG. 5 is a cross sectional view showing a liquid crystal display device according to a modification.

Consequently, in the modification of the invention, the end 62a is bent in an L character shape as shown in FIG. 5. Herewith, the area in which the outer shape of the frame 63 is covered by the metal unit 62 is increased as compared with the liquid crystal display device 100a of FIG. 3 by the bent end 62a even when the length of the end 62a is not long enough to be folded. Accordingly, the strength of the liquid crystal display device 100f against impact or the like can be increased.

Figure 16:
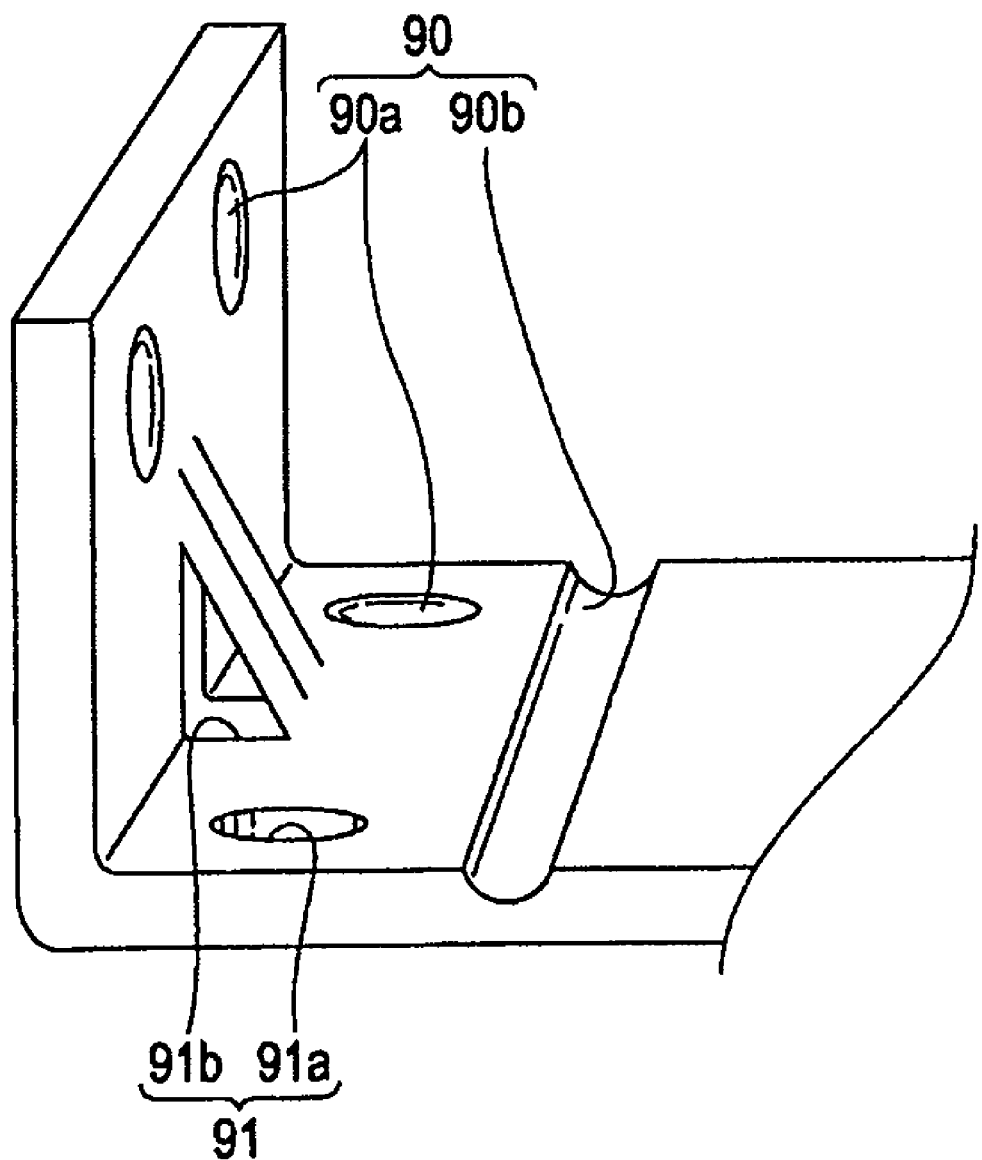
FIG. 16 is a perspective view showing an end of the metal unit according to a modification.

As shown in FIG. 16, the area in which the metal unit 62 and the resin unit 61 are adhered is increased by providing irregularities 90 and holes 91 on the surface of the end 62a of the metal unit. Herewith, the strength of the liquid crystal display device 100f can be increased. Note that the irregularity 90 may be, for example, a groove 90b that is hollowed to have a half cylinder shape besides the hollow 90a having an elliptical shape. Further, a plurality of the grooves 90b may be provided. The hole 91 includes a hole 91b that is formed by deforming a part of the bent portion of the metal unit 62 to have a bar shape or the like besides a columnar hole 91a. By forming the hole 91b and burying the hole 91b by the resin unit 61, the resin unit 61 is embedded in the hole 91b of the metal unit. That is, the area in which the metal unit 62 and the resin unit 61 are adhered is increased. Accordingly, the strength of the liquid crystal display device 100f can be increased.

In the embodiments, the frame 63 is formed by an insert molding. However the frame 63 may be formed by an outsert molding.

Electronic Apparatus

Next, a specific example of an electronic apparatus to which any one of the liquid crystal display devices 100, 100b to 100f according to the embodiments can be applied will be described with reference to FIGS. 17A, 17B.

First, an example will be described in which the liquid crystal display device 100 according to the aforementioned each embodiment is applied to a display unit of a portable personal computer (so called note type personal computer). FIG. 17A is a perspective view showing a structure of the personal computer. As shown in FIG. 17A, the personal computer 710 is equipped with a main body 712 equipped with a key board 711, and a display unit 713 to which the liquid crystal display device 100 according to the invention is applied.

Subsequently, an example will be described in which any one of the liquid crystal display devices 100, 100b to 100f according to the embodiments is applied to a display unit of a cellular phone. FIG. 17B is a perspective view showing a structure of the cellular phone. As shown in FIG. 17B, the cellular phone 720 is equipped with a plurality of operation buttons 721, an ear piece 722, a mouth piece 723, and a display unit 724.

Figure 17A:
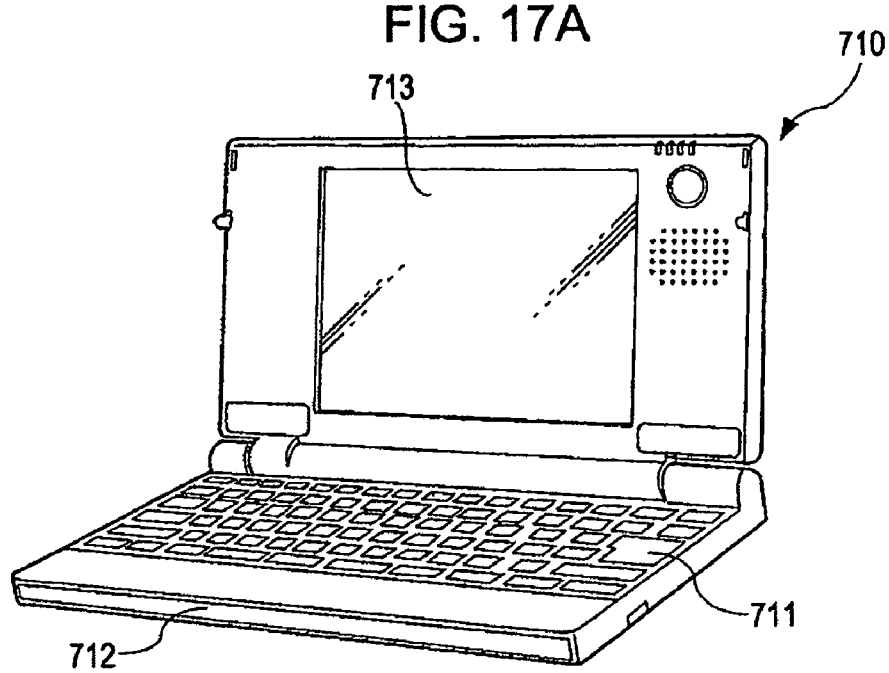
FIGS. 17A, 17B are each a diagram showing an electronic apparatus to which the liquid crystal display device of the embodiment is applied.
Figure 17B:
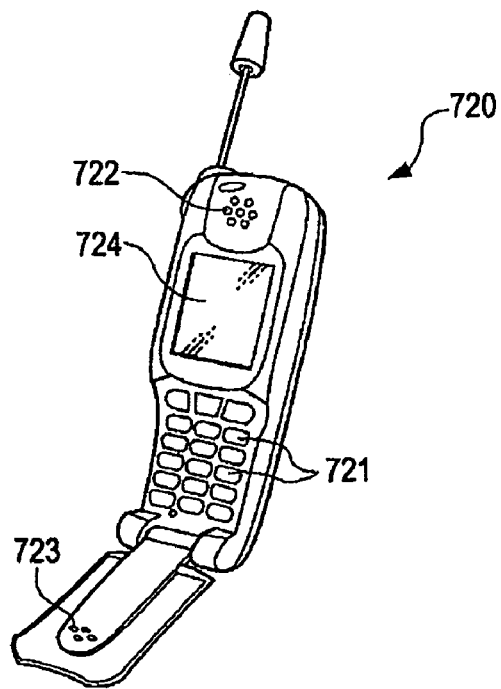

Note that as an electronic apparatus to which any one of the liquid crystal display devices 100, 100b to 100f according to the invention can be applied, besides the personal computer and the cellular phone shown in FIGS. 17A, 17B, there are included a liquid crystal television, a view finer type or monitor-direct-view type video tape recorder, a car navigation device, a pager, electronic organizer, an electronic calculator, a word processor, a work station, a video phone, a POS terminal, a digital still camera, and the like.

INDUSTRIAL APPLICABILITY

According to the invention, an electro optical device is equipped with a display panel and a frame. The display panel is fixed with frame. The frame is constituted by a metal unit and a resin unit that are integrally formed. The metal unit is fixed in the resin unit in the state where an end is folded. Since an end of the metal unit is folded, the thickness of the metal unit is increased. Accordingly, the strength of the electro optical device against impact or the like can be increased. Accordingly, the invention can be widely applied to an electro optical device or an electronic apparatus such as a liquid crystal device, an electroluminescence device, or the like. For example, besides a cellular phone and a personal computer, there are included a liquid crystal television, a view finer type or monitor-direct-view type video tape recorder, a car navigation device, a pager, an electrophoresis device, an electronic organizer, an electronic calculator, a word processor, a work station, a video phone, a POS terminal, an electronic apparatus equipped with a touch panel, a device equipped with an electronic emission element (FED: Field Emission Display or SCEED: Surface-Conduction Electron-Emitter Display), and the like.

What is claimed is:

1. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is bent at a side of the display panel,
wherein an end of the resin unit is projected outside from the end of the metal unit.

2. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is folded at a side of the display panel,
wherein a step between a bottom of the metal unit and the folded end of the metal unit is buried by the resin unit.

3. The electro optical device according to claim 1, wherein the metal unit of an outer surface of the frame is exposed.

4. The electro optical device according to claim 1, wherein the metal unit of an inner surface of the frame is exposed.

5. The electro optical device according to claim 1, wherein the metal unit of a bottom of the frame is exposed.

6. The electro optical device according to claim 1, wherein the metal unit is fixed in the resin unit.

7. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is bent at a side of the display panel,
wherein the metal unit is formed so that an end of the end is folded to overlap in a thickness direction of the display panel.

8. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is bent at a side of the display panel,
wherein the metal unit is formed so that the end has a multi folded shape.

9. The electro optical device according to claim 1, wherein the end of the metal unit is folded by a heming process.

10. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is bent at a side of the display panel,
wherein the resin unit has a convex portion at an end, and
wherein the end of the metal unit is bent to oppose the metal unit to keep a predetermined space with the metal unit, and the end of the metal unit is embedded in the resin unit to cover the convex portion.

11. An electro optical device comprising:
a frame including a metal unit and a resin unit; and
a display panel stored in the resin unit, wherein
the resin unit is integrally formed with the metal unit to form the frame including a resin material, and
at least a part of an end of the metal unit is buried in the resin unit in the state where the end is bent at a side of the display panel,
wherein the metal unit has a hole that passes through the metal unit or an irregularity formed on a surface of the metal unit, and the resin unit is formed to cover the hole or the irregularity.

12. An electronic apparatus equipped with the electro optical device according to claim 1.

* * * * *